(12) United States Patent
Kohno et al.

(10) Patent No.: US 6,180,966 B1
(45) Date of Patent: Jan. 30, 2001

(54) TRENCH GATE TYPE SEMICONDUCTOR DEVICE WITH CURRENT SENSING CELL

(75) Inventors: Yasuhiko Kohno; Naoki Sakurai, both of Hitachi; Mutsuhiro Mori, Mito, all of (JP)

(73) Assignee: Hitachi, Ltd., Tokyo (JP)

( * ) Notice: Under 35 U.S.C. 154(b), the term of this patent shall be extended for 0 days.

(21) Appl. No.: 09/047,349

(22) Filed: Mar. 25, 1998

(30) Foreign Application Priority Data

Mar. 25, 1997 (JP) .................................................. 9-071144

(51) Int. Cl.[7] .......................... H01L 29/74; H01L 31/111; H01L 29/76; H01L 29/94; H01L 31/062
(52) U.S. Cl. .......................... 257/173; 257/174; 257/328; 257/331; 257/332; 257/378
(58) Field of Search .................................... 257/173, 174, 257/139, 140, 328, 331, 332, 378

(56) References Cited

U.S. PATENT DOCUMENTS 5,563,435 * 10/1996 Kohno et al. .......................... 257/328
5,821,580 * 10/1998 Kuwahara .............................. 257/330
5,918,114 * 6/1999 Choi et al. ............................ 438/134

FOREIGN PATENT DOCUMENTS 3-16268  1/1991 (JP) .
6-105783  12/1994 (JP) .

OTHER PUBLICATIONS

Kamata et al., "Trench Gate IGBT with Current Sense Device", Trans. of the 9th Nat'l. Convention of Institute of Electrical Engineers, Japan, Mar. 10, 1997.

Kudoh et al., "Current Sensing IGBT Structure with Improved Accuracy", Proceedings of 1995 Int'l Symposium on Power Semiconductor Devices & ICs, Yokohama, Japan, pp. 119–122.

Robb et al., "Current Sensing in IGBTs for Short–Circuit Protection", Proc. of the 6th Int'l Symposium on Power Semiconductor Devices & ICs, May 31–Jun. 2, 1994, pp. 81–85.

* cited by examiner

Primary Examiner—Ngân V. Ngô
(74) Attorney, Agent, or Firm—Antonelli, Terry, Stout & Kraus, LLP (57) ABSTRACT

A trench gate type semiconductor device with a current sensing cell is composed so that the orientation of crystal face at side walls of trenches forming channels of trench gates in a main cell is equal or almost equal, or equivalent or almost equivalent to the orientation of crystal face at side walls of trenches forming channels of trench gates in a current sensing cell, which brings the same performance to the main and sense cells, whereby the high accuracy current sensing can be realized.

7 Claims, 9 Drawing Sheets

SENSE IGBT REGION | MAIN IGBT REGION

TRENCH GATE TYPE SEMICONDUCTOR DEVICE WITH CURRENT SENSING CELL

BACKGROUND OF THE INVENTION

The present invention relates to a semiconductor device for use in electrical products, such as an electric locomotive, home electric equipment, and so forth; and, in particular, the invention relates to improvement of a current sensing function provided in a semiconductor device.

In order to reduce the energy consumption in electric device, such as an inverter, it has been proposed to decrease the power loss in an insulated gate bipolar transistor (hereafter referred to as IGBT) of the type used as a switching element in an inverter. Recently, an IGBT in which gate electrodes are buried in a silicon substrate, which is called a trench gate type IGBT, has been actively developed.

In a trench gate type IGBT, it is possible to increase the components per chip to a higher level in comparison with a conventional planar gate type IGBT. Consequently, the voltage decrease which occurs during a current applying state in a chip, what is called the ON voltage, is smaller than that in a conventional planar gate type IGBT, and so the power loss of the device also can be reduced. However, a trench gate type IGBT has a problem in that, since the saturation current becomes larger because of the high number of components per chip, and an over-current flows in the case of a fault, such as a short circuit of a load, it breaks down more easily than a planar gate type IGBT.

A counter-measure for solving this problem is to provide an over-current protection circuit for detecting an over-current flow in the case of a fault to protect the IGBT. However, a highly accurate current sensing function is necessary for such an over-current protection circuit. Especially, in a trench gate type IGBT, since the increase in the rate of the current in a turn-on state is large, and a large current flows quickly to damage the IGBT, an accurate and high-speed over-current protection function is required.

Figure 3:
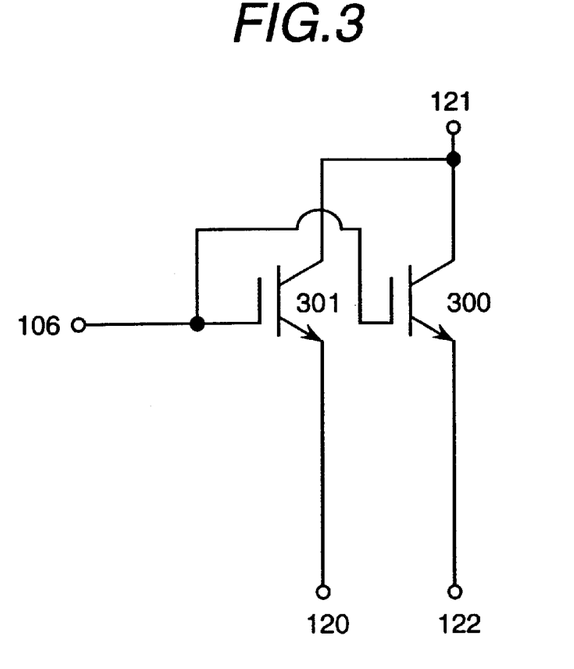
FIG. 3 is a schematic circuit diagram showing an equivalent circuit of an IGBT having a sense terminal.

FIG. 3 shows an equivalent circuit of an IGBT having an over-current sensing function. The IGBT having an over-current sensing function is composed of a main IGBT 300, a sense IGBT 301, a collector electrode 121 commonly used for the main IGBT 300 and the sense IGBT 301, a gate electrode 106, an emitter electrode 122 of the main IGBT 300, and an emitter electrode 120, which is provided separately from the emitter electrode 122 and is referred to as a sense electrode.

Generally, a sense IGBT is designed so that the number of cells of the sense IGBT is approximately 1/1000 of that of cells of the main IGBT. Consequently, the sense IGBT can extract a current flow of about 1/1000 of a current flow in the main IGBT. By monitoring such a small current flow, the sense IGBT can monitor the state of a large current flowing in the main IGBT. However, actually, the ratio of the small current flow in the sense IGBT (referred to as a sense current flow) to the large current flow in the main IGBT (referred to as a main current flow) is not always equal to the ratio of the number of cells of the sense IGBT to that of cells of the main IGBT, and this current flow ratio changes easily, corresponding to the collector voltage, the temperature in the IGBTs, etc. For a planar gate type IGBT, the number of structures necessary to attain a stable current flow ratio has been devised. For example, such a structure is disclosed in a paper: "Current Sensing IGBT for Future Intelligent Power Module" by M. Kudoh et al., Proceedings ISPSD, pp. 303–306, 1996.

Figure 4:
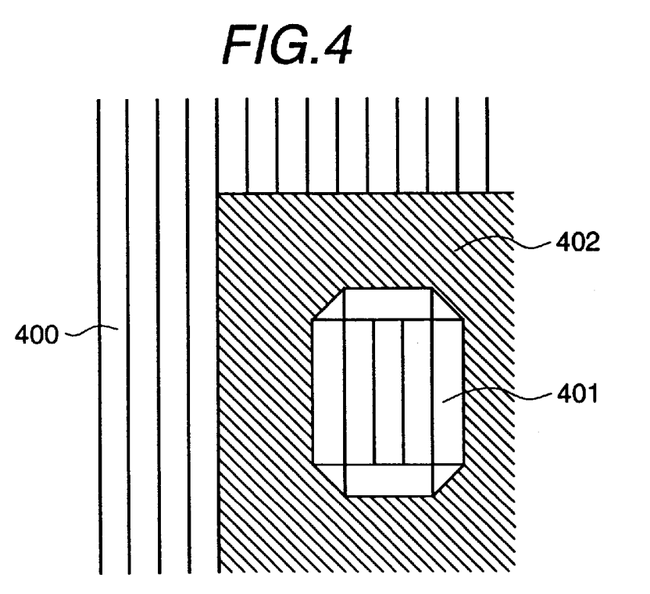
FIG. 4 is a plan view showing a layout of cells of a sense IGBT arranged in a planar gate type IGBT.

In FIG. 4, an example of a layout of cells of a sense IGBT in a planar gate type IGBT is shown. By arranging the cells 401 of the sense IGBT as shown in FIG. 4, an improvement in the accuracy of the current sensing operation is attained, or by providing a separation region between the cells of the sense IGBT and those of the main IGBT, the accuracy of current sensing is improved.

However, the inventors have found that even when a layout of cells of a sense IGBT, which has been adopted for a conventional planar gate type IGBT, is applied to a trench gate type IGBT, it does not improve the current sensing accuracy of the sense IGBT of the trench gate type.

One of the reasons for this is that the current sensing accuracy of a sense IGBT is degraded by the variation in shapes of trench gates in a sense IGBT, which variation is produced during element processing and causes differences from the shapes of the trench gates in a main IGBT. Further, the current sensing sensitivity of a sense IGBT is degraded because of the interaction between cells of a sense IGBT and those of a main IGBT.

SUMMARY OF THE INVENTION

An object of the present invention is to provide a trench gate type semiconductor device with a high-accuracy current sensing function in consideration of the above-mentioned problems.

To attain the above object, the present invention provides a semiconductor device including a main cell having trench gates, for the flow of a main current therein, and current sensing cell having trench gates, for the flow of a detection current therein, the main cells and the current sensing cells being formed at the same semiconductor substrate, wherein the orientation of the crystal face at side walls of the trench gates in the main cell is the same or almost the same as that at the side walls of the trench gages in the current sensing cell, or is an equivalent or an almost equivalent orientation of the crystal face at the wall sides of the trench gates in the current sensing cell.

In accordance with the above-mentioned structure of a semiconductor device, since the ratio of current flow in the current sensing cell to that in the main cell can be accurately set by making the orientation of the crystal face at the side walls of the trench gates in the main cell equal or almost equal, or equivalent or almost equivalent, to that at the side walls of the trench gages in the current sensing cell, it is possible to improve the current sensing sensitivity.

DETAILED DESCRIPTION OF THE EMBODIMENTS

Hereinafter, details of the present invention will be explained with reference to embodiments shown in the drawings.

In the following, the first embodiment of a semiconductor device according to the present invention will be explained.

Figure 1:
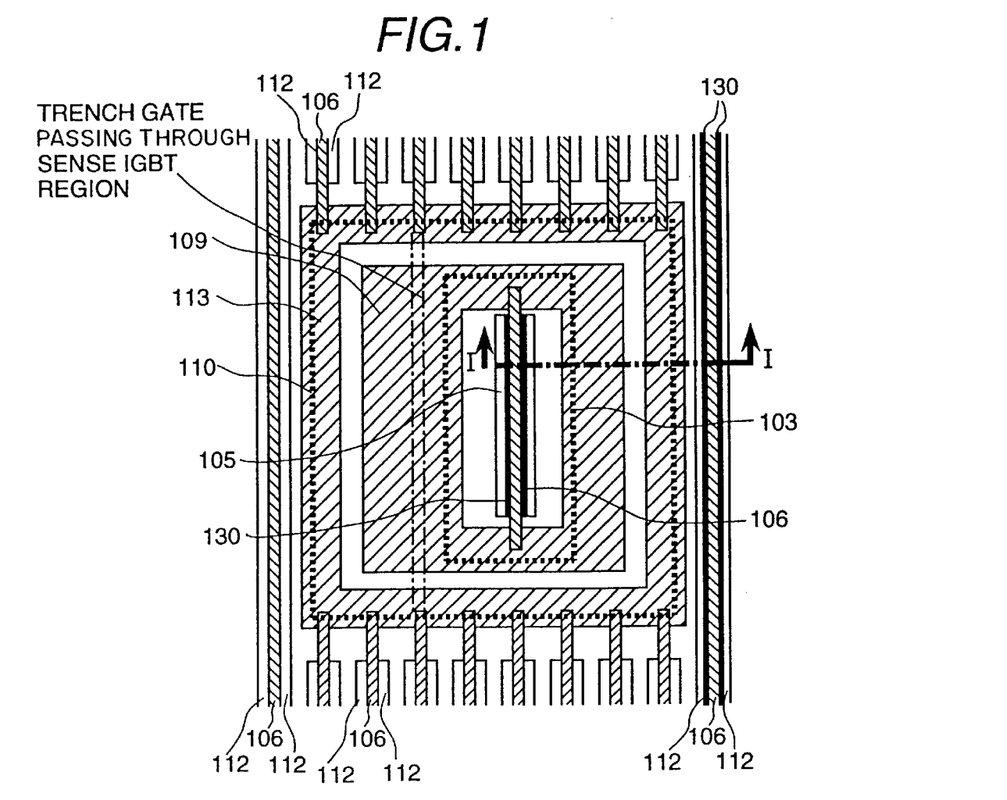
FIG. 1 is a plan view showing the structure of a semiconductor device representing a first embodiment according to the present invention.
Figure 2:
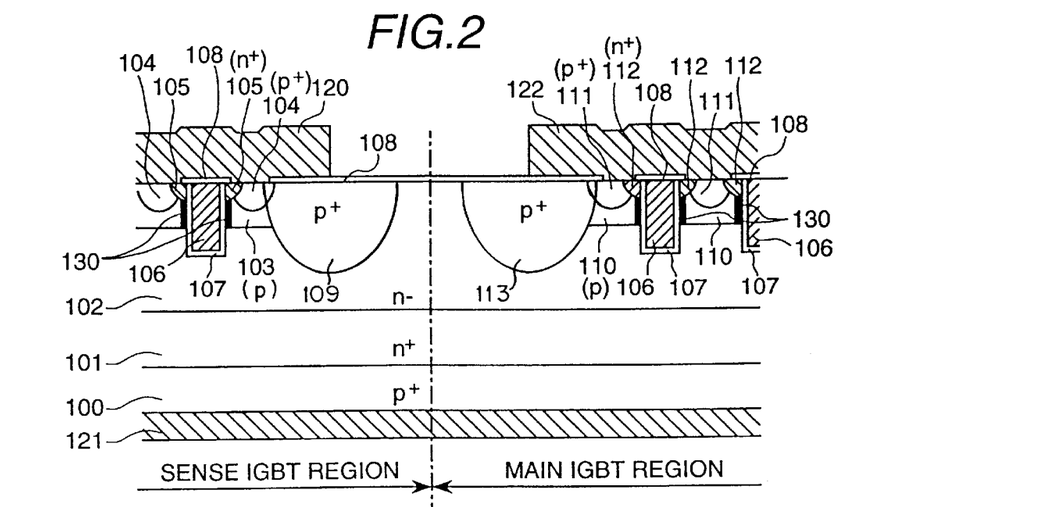
FIG. 2 is a vertical cross-sectional view showing the structure of the first embodiment according to the present invention.

In FIG. 1 and FIG. 2, a plan view and a vertical cross-sectional view showing the structure of the first embodiment are shown, respectively. Further, FIG. 2 shows a cross-sectional view at the position (I—I) indicated in FIG. 1.

The semiconductor device of the first embodiment shown in FIG. 1 and FIG. 2 is composed of the following elements: a collector layer 100, a buffer layer 101 adjacent to the collector layer 100, a drift layer 102 disposed adjacent to the buffer layer 101 and having a lower impurity concentration than that of the buffer layer 101, a sense base layer 103 (p) formed in the drift layer 102 of a sense IGBT region, sense contact layers 104 formed in the sense base layer 103, sense emitter layers 105 formed in the sense base layer 103, trench gate electrodes 106 formed in a silicon substrate so as to reach the drift layer 102, gate insulation films 107 for insulating the trench gate electrodes 106 from the silicon substrate, inter-layer insulation films 108 for insulating the electrodes from the silicon substrate, a sense well layer 109 formed in contact with the sense base layer 103 forming the side end part of the sense IGBT region, a main base layer 110 formed in the draft layer 102 of a main IGBT region, main contact layers 111 formed in the main base layer 110, main emitter layers 112 formed in the main base layer 110, a main well layer 113 formed in contact with the main base layers 110 forming the side end part of the main IGBT region, a sense electrode 120 formed in contact with the sense contract layers 104 and the sense emitter layers 105, a collector electrode 121 formed on the whole face of the collector layer 100, an emitter electrode 122 formed in contact with the main contact layers 111 and the main emitter layers 112, and channel forming layers 130 formed along side walls of the trench gates 106 in the main base layers 110 and the sense base layers 103. In FIG. 1, an inside one of two rectangles shown by dotted lines indicates a boundary of the sense base layer 103, and a region inside this boundary is the sense base layer 103. Similarly, in FIG. 1, an outside one of two rectangles shown by dotted lines indicates a boundary of the main base layer 110, and the main base layer 110 is formed outside this boundary. Meanwhile, although the channel forming regions 130 are shown only at the sense IGBT gate and a part of the main IGBT gates in FIG. 1 for convenience of illustration, the channel forming regions 130 are actually formed at all gates of the main IGBT.

A feature of this embodiment is that the orientation of the crystal face at the surfaces of the semiconductor layers of the side walls (hereafter simply described as crystal face at side walls) of the trench gates in a main IGBT is made equal or almost equal to that of the crystal face at the side walls in the trench gates in a sense IGBT by forming the trench gages of the main IGBT in parallel with those of the sense IGBT.

One of the important factors determining the performance of an IGBT is the electron mobility in a channel region. Further, the mobility strongly depends on the orientation of the crystal face in the region in which a channel is formed. As shown by the fact that the mobility at the crystal face (111) is approximately a half of that at the crystal face (100), it is apparent that the mobility changes according to the orientation of the crystal face. Thus, if the orientation of the crystal face at side walls in the trenches of the gates in a main IGBT is different from that of the crystal face at the side walls in the trenches of the gates in a sense IGBT, since the condition of current flow in the main IGBT becomes different from that of the current flow in the sense IGBT, the ration of the two current flows shifts from a target value.

Further, if the orientation of the crystal face at the side walls in the trenches of the gates in a main IGBT is different from that of the crystal face at the side walls in the trenches of the gates in a sense IGBT, since a discrepancy between the shape of the trenches in the main IGBT and that of the trenches in the sense IGBT may be produced during processing of the trenches, the current sensing accuracy is deteriorated.

Therefore, if the trench gates of a main IGBT are formed in parallel to those of a sense IGBT, as provided in this embodiment, since the orientation of the crystal face at the side walls in the trenches of the gates in the main IGBT can be made equal to that of the crystal face at the side walls in the trenches of the gates in the sense IGBT, the ratio of current flow in the sense IGBT to that in the main IGBT can be accurately set to a desired value. Moreover, if the angle between the orientation of the crystal face at the side walls of the trenches in the main IGBT and that of the trenches in the sense IGBT is within 5 deg., that is, if the two orientations are almost parallel to each other, the above-mentioned advantage due to the present invention still can be obtained.

In producing the above-mentioned structure of a semiconductor device according to this embodiment, it is desirable to form the trench gates of a main IGBT and those of a sense IGBT simultaneously. The reason for this is that, if the trench gates of the main IGBT are produced in a process step different from a process step in which the trench gates of the sense IGBT are produced, the states of the side walls in the trenches as between the main IGBT cell and the sense IGBT cell possibly may be different.

Another feature of this embodiment is that the trench gates of a main IGBT are separated from those of a sense IGBT. This structure is realized, as shown in FIG. 1, by providing a region in which a trench is not formed, between the main IGBT region and the sense region, to separate the trench gates of a main IGBT from those of a sense IGBT.

In an ON state of an IGBT, an accumulation layer is formed at the surface of the side walls in each trench gate. The resistance of the accumulation layer is less than that of a drift layer in many cases. Consequently, a leakage current flows between a main IGBT and a sense IGBT, and so the current sensing sensitivity is deteriorated. As indicated in the above-mentioned feature, if the trench gates of the main IGBT are separated from those of the sense IGBT by providing such a region in which a trench is not formed, since the formation of an accumulation layer can be avoided, the degradation of the current sensing sensitivity can be prevented.

Furthermore, since the trench gates in the main IGBT are separated from the trench gates in the sense IGBT, this embodiment has an advantage in that it is possible to control a main IGBT and a sense IGBT separately. For example, it becomes possible to delay the operation of the sense IGBT by connecting a resistor only to the sense IGBT. In addition, this embodiment has another advantage in that it is possible to increase the freedom of the layout for the sense IGBT.

Another feature of this embodiment is that the sense IGBT is doubly surrounded by the sense well layer 109 and the main well layer 113, each of which is deeper than the trench gates. Further, the trench gates of the main IGBT and the trench gates of the sense IGBT terminate at the main well layer 113 and the sense well layer 109, respectively. According to this structure, since the degradation of a withstand voltage at the cut end part of each trench gate can be prevented, the reliability of the chip is improved. Further, since the well layers 109 and 113 are doubly provided via the drift layer 102, an interaction between the sense IGBT and the main IGBT also can be prevented, which also improves the current sensing accuracy.

Again, this embodiment has the feature that a trench is arranged across the doubly provided well layers 109 and 113 surrounding the sense IGBT. This feature will be explained with reference to FIG. 1. If a trench gate of the main IGBT, such as "a trench gate passing through the sense IGBT region" shown by dashed lines in FIG. 1, passes through a region which is not occupied by a trench gate of the same IGBT, a leakage current flows between the sense IGBT and the main IGBT through an accumulation layer of low resistance which is formed on the surface of the provisionally shown trench gate during the ON state of the IGBTs, which deteriorates the current sensing sensitivity. Therefore, it is desirable to restrict the number of trench gates in the main IGBT, which are arranged across the sense IGBT region, and it is best that any trench gate of the main IGBT does not cross the sense IGBT as shown in FIG. 1. In accordance with the above-mentioned structure, it is possible to prevent the degradation of the current sensing sensitivity, which is due to the interaction between the main IGBT and the sense IGBT.

Moreover, since IGBTs according to this embodiment can be produced without requiring any special processing, the trench gate type IGBT can be formed using a process similar to that used for a conventional trench gate type IGBT.

As mentioned above, in accordance with this embodiment, a trench gate type IGBT with a current sensing cell of low cost and high accuracy can be realized.

Furthermore, the above-mentioned structure in which trench gates terminate at well layers is applicable not only to the trench gate IGBT with a current sensing cell, as explained in connection with the above embodiment, but also to other types of trench gate IGBT or MOSFET which have a current sensing cell.

In the following, a second embodiment of this invention will be explained.

Figure 5:
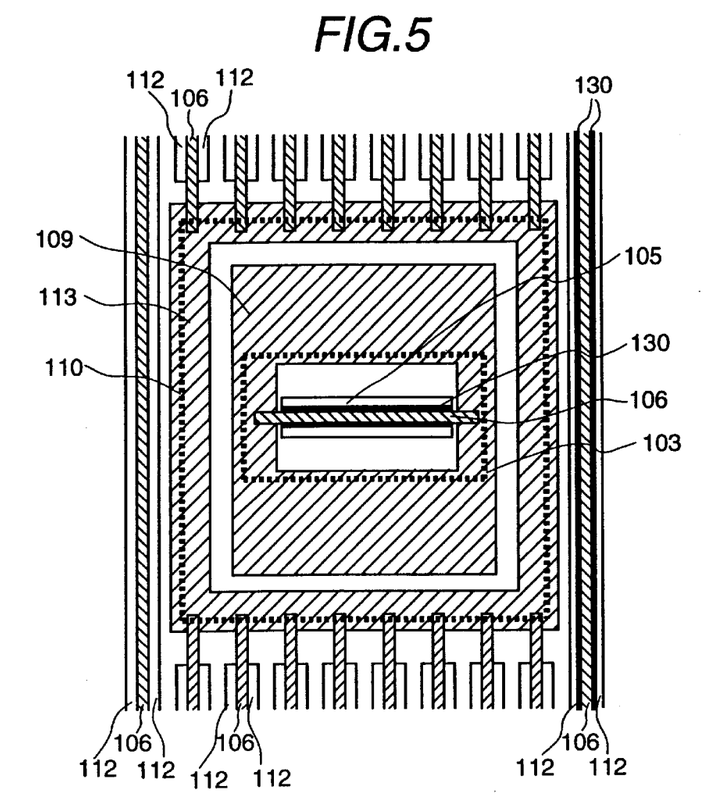
FIG. 5 is a plan view showing the structure of a semiconductor device representing a second embodiment according to the present invention.

FIG. 5 shows a plan view of the structure of a semiconductor device representing a second embodiment according to the present invention. In FIG. 5, the same numerals are used to identify the same elements as those shown in FIG. 1.

A feature of this embodiment is that the trench gates of the sense IGBT are arranged perpendicularly to the trench gates of the main IGBT. As an example, a case in which a wafer having a crystal face orientation of (100), will be explained. If the orientation of the crystal face at the side walls of the trench gates of the main IGBT is (110), when the trench gates are formed perpendicularly to the trench gates of the main IGBT, the orientation of the crystal face at the side walls of those trench gates becomes a crystal face orientation which is crystallographically equivalent to the face orientation of (110). By arranging the trench gates of the sense IGBT according to this embodiment, it is possible to form the orientation of the crystal face at the side walls of the trench gates in the sense IGBT so as to be equivalent to the orientation of the crystal face of the side walls in the trench gates of the main IGBT. Thus, this embodiment has the same effect as that of the first embodiment. Moreover, if the angle between the orientation of the crystal face at the side walls of the trenches in the sense IGBT and an orientation equivalent to the orientation of the trenches in the main IGBT is within 5 deg., that is, the two orientations are crystallographically almost equivalent to each other, the above-mentioned advantage due to the present invention still can be obtained.

Figure 8:
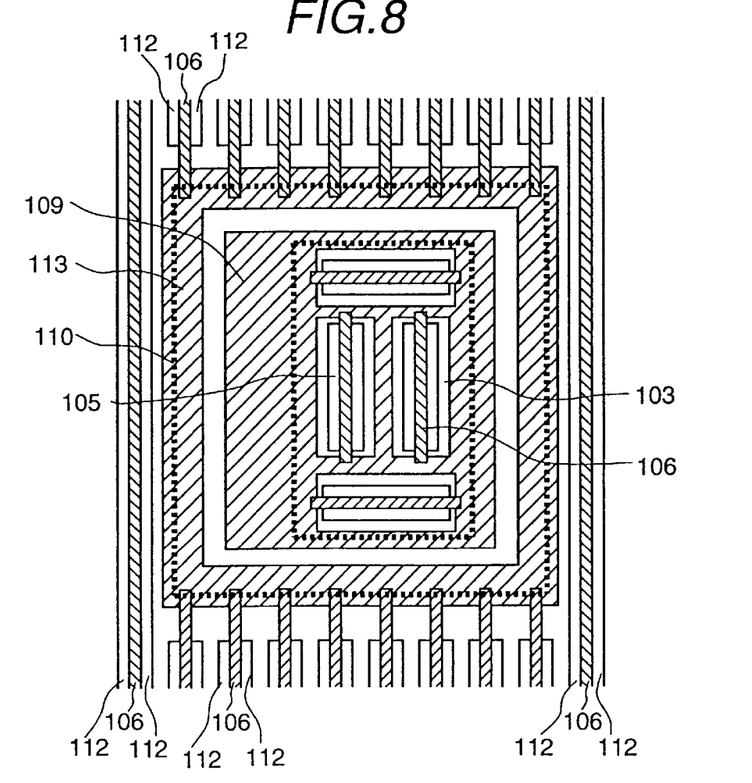
FIG. 8 is a plan view showing the structure of a modification of a semiconductor device representing the second embodiment according to the present invention.

Further, as shown in FIG. 8, by using a sense IGBT composed by combining trench gates arranged perpendicularly and trench gates arranged in parallel to trench gates of the main IGBT, since the side walls of the trench gates all have crystal face orientation of (110), this arrangement also will have the same effect as that of the second embodiment.

Although a wafer having crystal face orientation of (100) has been explained as an example, using a wafer having another crystal face orientation brings the same effect by applying this embodiment.

Figure 9:
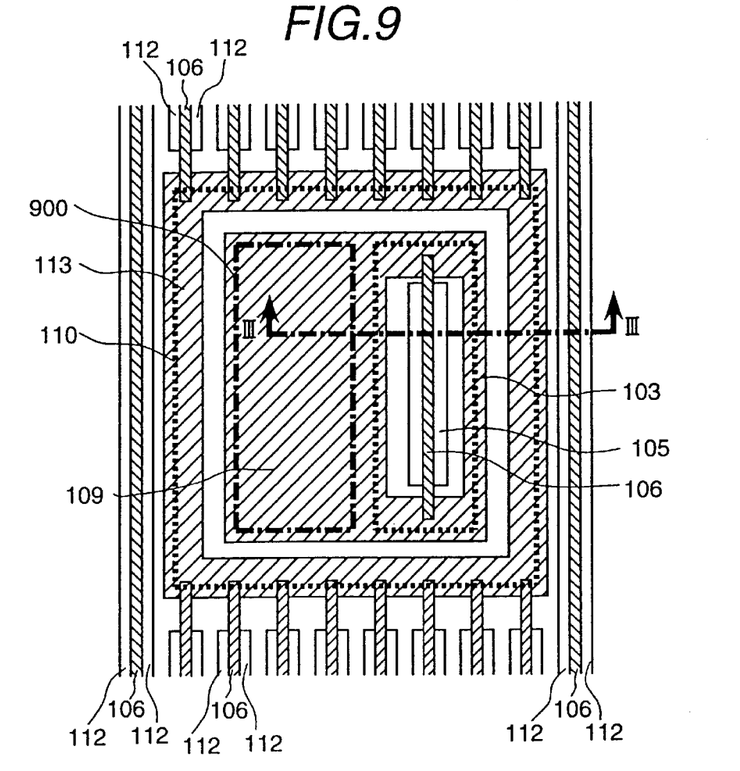
FIG. 9 is a plan view showing the structure of a semiconductor device representing a third embodiment according to the present invention.
Figure 10:
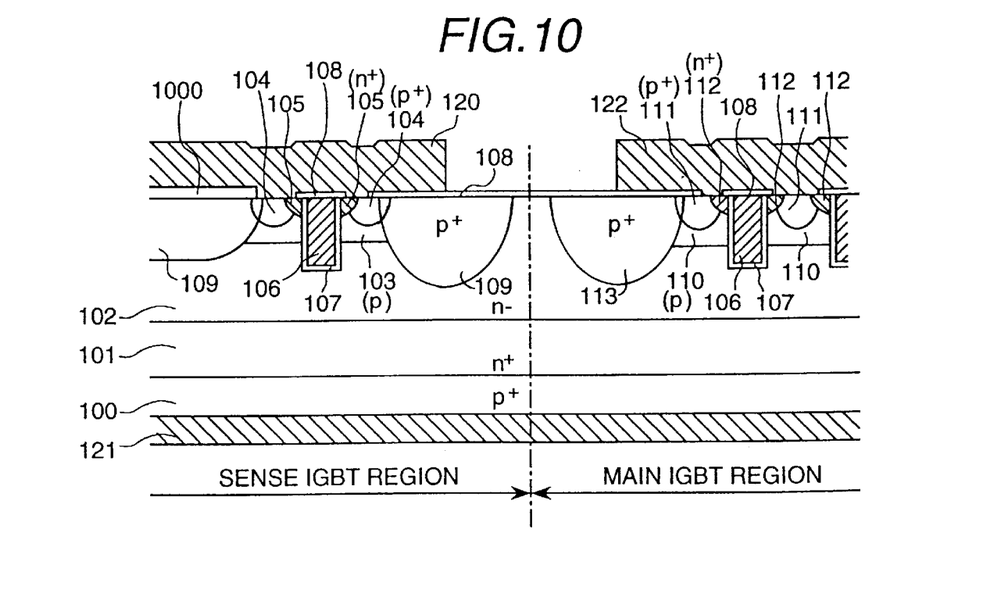
FIG. 10 is a vertical cross-sectional view of the structure of the semiconductor device shown in FIG. 9.

FIG. 9 and FIG. 10 show a plan view and a vertical cross-sectional view of the structure of a semiconductor device representing a third embodiment according to the present invention, respectively. FIG. 10 shows a cross section at the position (III—III) shown in FIG. 9. In FIG. 9 and FIG. 10, the same numerals are used to denote the same elements as those shown in FIG. 1, FIG. 2, FIG. 5 and FIG. 8. Elements in FIG. 9 and FIG. 10 which are different from those shown in FIG. 1, FIG. 2, FIG. 5 and FIG. 8 are a thick oxide film 1000 formed on the sense well layer 109 and a sense pad 900 formed on the thick oxide film 1000.

A feature of this embodiment is that the sense pad 900 used for bonding wire connection is provided on the sense well layer 109. To the sense pad 900, wires leading to circuits outside the chips are connected by bonding. During a bonding process, a large shock is applied to the pad 900, and an oxide film under the pad 900 possibly may be broken, which causes a short circuit of an emitter electrode and a silicon substrate. If the well layer 113 of the main IGBT is formed under the pad 100 in the silicon substrate, the sense electrode 120 is electrically connected to the emitter electrode 122 of the main IGBT. Consequently, the sense potential can not be accurately obtained. On the other hand, if no element is formed under the pad 900 in the silicon substrate, and the drift layer 102 is exposed, the sense electrode 120 is electrically connected to the drift layer 102, which causes a decrease of the main withstand voltage. According to this embodiment, even if the oxide film 1000 under the sense pad 900 is broken by a shock during wire bonding, and the sense electrode 120 is shorted to the silicon substrate, since the sense well layer 109 has the same potential as that of the sense electrode 120, the degradation in the current sensing sensitivity or the main withstand voltage can be avoided.

The sense pad 900 is formed on the sense well layer 109, and the trench gates are arranged so as not to cross each other under the sense pad 900. It is more preferable to provide the sense pad 900 in a region in which the trench gates of the sense IGBT do not exist, as shown in FIG. 9. This is because, if there are trench gates under the sense pad 900, the withstand voltage may be degraded by deficiencies due to a shock in bonding, of the trenches,.

In the following, a fourth embodiment of this invention will be explained.

Figure 11:
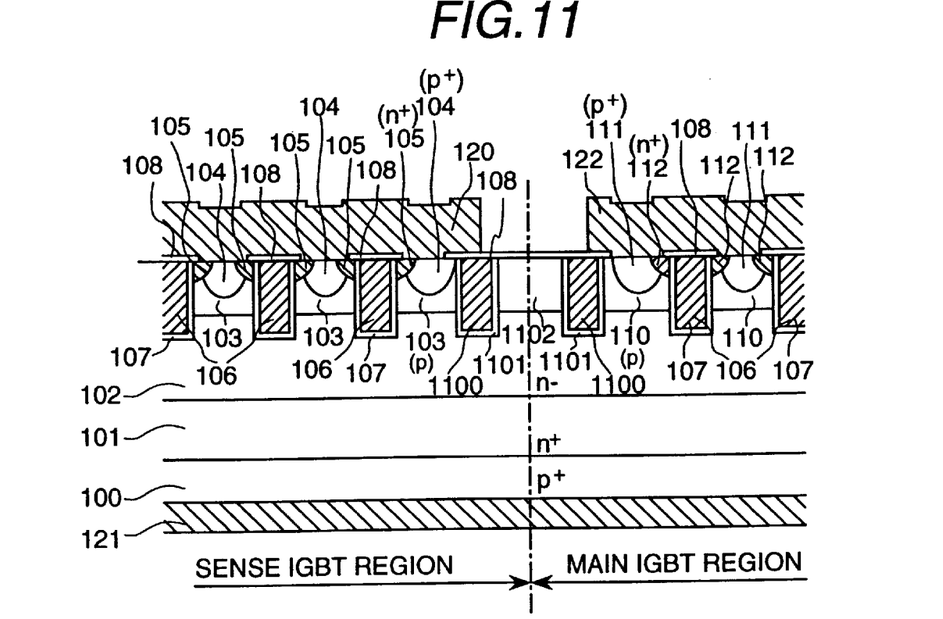
FIG. 11 is a vertical cross-sectional view showing the structure of a semiconductor device representing a fourth embodiment according to the present invention.

FIG. 11 shows a vertical cross-sectional view of a semiconductor device representing a fourth embodiment according to the present invention. In FIG. 11, the same numerals are used to denote the same elements as those shown in FIG. 1, FIG. 2, FIG. 5, FIG. 8 and FIG. 10.

Elements shown in FIG. 11 which are different from those shown in FIG. 1, FIG. 2, FIG. 5, FIG. 8 and FIG. 10 are dummy trench gates 1100 formed between the main IGBT region and the sense IGBT region, dummy trench gate insulation films 1101 for insulating the dummy trench gates 1100 from the drift layer 102, and a dummy base layer 1102 formed adjacent to the dummy trench gates 1100.

A feature of this embodiment resides in the fact that a dummy cell which does not function as an IGBT is arranged between the main IGBT and the sense IGBT. Meanwhile, in this embodiment, a main well layer and a sense well layer are not formed.

If the sense IGBT is formed immediately adjacent to the main IGBT to suppress an increase of an area in forming the sense IGBT as small as possible, the current sensing sensitivity is deteriorated. The reason for this is that the potential of the base layer 110 in the main IGBT affects that of the base layer 103 in the sense IGBT.

According to this embodiment, this problem can be solved by arranging the dummy cell between the sense IGBT region and the main IGBT region. The dummy cell is composed of the dummy base layer 1102 and the dummy trench gates 1100 sandwiching the dummy base layer 1102. The dummy base layer 1102 is formed separately and is electrically insulated from the base layer 110 of the main IGBT and the base layer 103 of the sense IGBT. Therefore, the potential of the dummy base layer 1102 is in a floating state and changes in response to the effects of the potential of elements surrounding the dummy base layer 1102. Thus, since the dummy base layer 1102 absorbs a potential difference between the main IGBT and the sense 19 IGBT, an interaction between the IGBTs can be suppressed. Although as the number of the dummy cells increases, the less the interaction can be reduced, necessarily the fewest number of dummy cells should be used, since too many dummy cells will decrease the area through which the main current can pass. Further, the trench gates 1100 can be connected to the trench gates 106 of the main IGBT. However, it is preferable when the dummy trench gate 1100 is separated from the trench gates 106 of the main IGBT and the sense IGBT and is in a floating state.

Furthermore, the above-mentioned structure in which a dummy trench gate is provided is applicable not only to the trench gate IGBT with a current sensing cell, as in the above embodiment, but also to other types of trench gate IGBT or MOSFET which have a current sensing cell.

In the following, a fifth embodiment will be explained.

Figure 15:
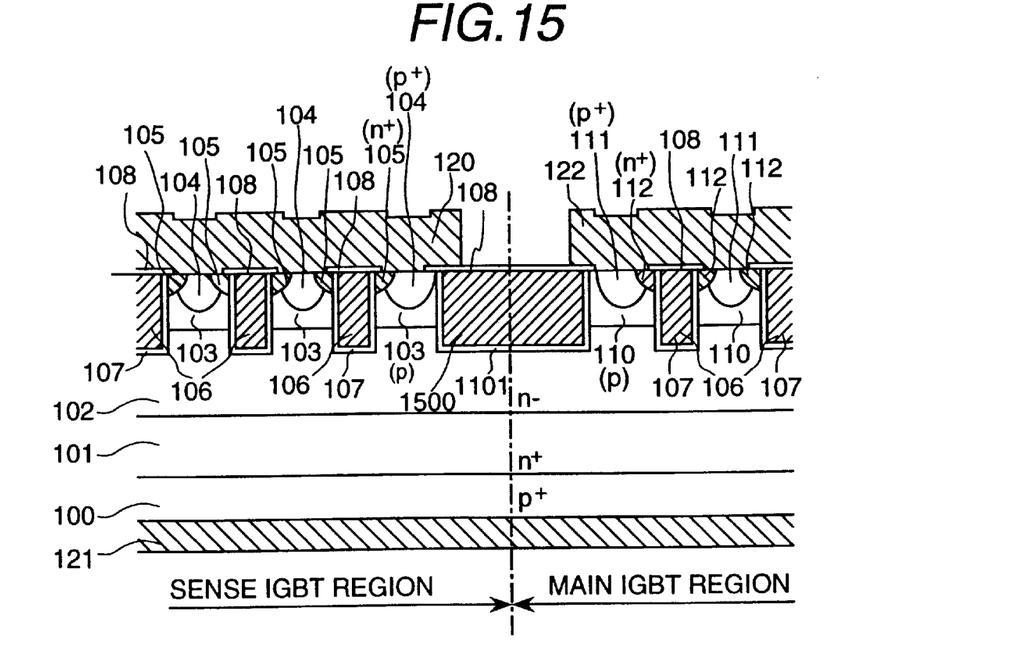
FIG. 15 is a vertical cross-sectional view showing the structure of a semiconductor device representing a fifth embodiment according to the present invention.

FIG. 15 is a vertical cross-sectional view showing the structure of a semiconductor device representing a fifth embodiment according to the present invention. In FIG. 15, the same numerals used to denote the same elements as those shown in FIG. 1, FIG. 2, FIG. 5, FIG. 8, FIG. 10 and FIG. 11.

An element shown in FIG. 15 which is different from the elements shown in FIG. 1, FIG. 2, FIG. 5, FIG. 8, FIG. 10 and FIG. 11 is a separation trench gate 1500 formed between the main IGBT region and the sense IGBT region, of which the width is wider than the width of the trench gates in the main and sense IGBTs. Meanwhile, in this embodiment, a main well layer and a sense well layer are not formed.

A feature of this embodiment is that the width of the separation trench gate 1500 is formed to be wider than that of the trench gates in the main and sense IGBTs, and separates the sense IGBT region from the main IGBT region.

In order to obtain the excellent current sensing accuracy of the sense IGBT, it is crucial to separate the sense IGBT from the main IGBT electrically. Especially, in a trench gate type IGBT, since the size of a unit cell is small, if main IGBT cells are arranged adjacent to a sense IGBT cell as arranged in a planer gate IGBT, sufficient insulation characteristics can not be realized, and a degradation of the detection sensitivity is caused by the interaction between the main IGBT region and the sense IGBT region.

According to this embodiment, by forming the trench gate to have a wide width between the main IGBT and the sense IGBT, it becomes possible to reduce the interaction between the main IGBT region and the sense IGBT region, which improves the current sensing sensitivity.

In addition, it is preferable to electrically separate the separation trench 1500 from the trench gate electrodes 106 in the main IGBT and the sense IGBT. During the ON operation state of the IGBTs, an accumulation layer is induced at the bottom part in the separation trench gate 1500, and an interaction between the IGBTs occurs through the accumulation layer. By electrically separating the separation trench gate 1500 from the trench gate electrodes 106, it is possible to prevent an accumulation layer from being generated, consequently it is possible to suppress any interaction between the IGBTs. As a separation method, various methods are effective, that is: separating the separation trench 1500 from the trenches 106 of the main and sense IGBT geometrically as mentioned in the first embodiment, separating the separation trench 1500 from the trenches 106 electrically by partially stuffing insulation material in the separation trench 1500, and separating the trench 1500 from the trenches 106 by forming a thick part in a gate insulation film of the trench 1500, which increases the gate threshold voltage.

Furthermore, the above-mentioned structure in which a separation trench gate is provided is applicable not only to a trench gate IGBT with a current sensing cell, as in the above embodiment, but also to other types of trench gate IGBT or MOSFET which have a current sensing cell.

In the following, a sixth embodiment will be explained.

Figure 12:
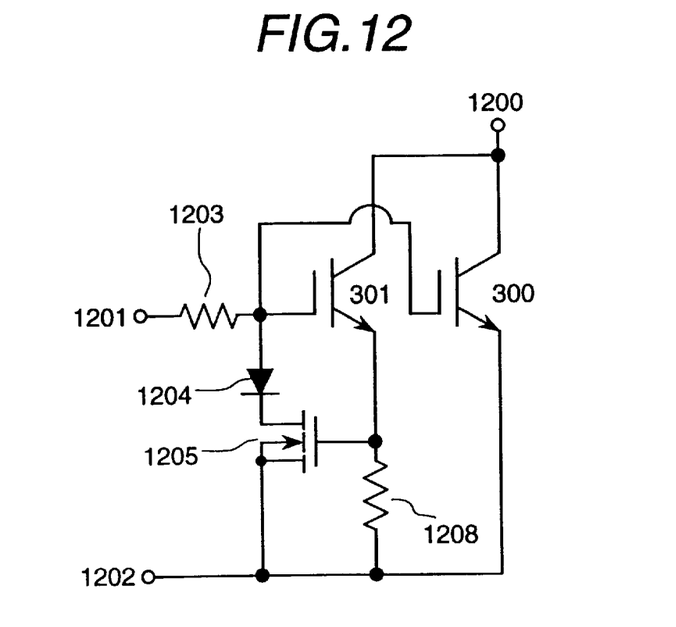
FIG. 12 is a schematic circuit diagram showing an equivalent circuit of a semiconductor device representing a sixth embodiment according to the present invention.
Figure 13:
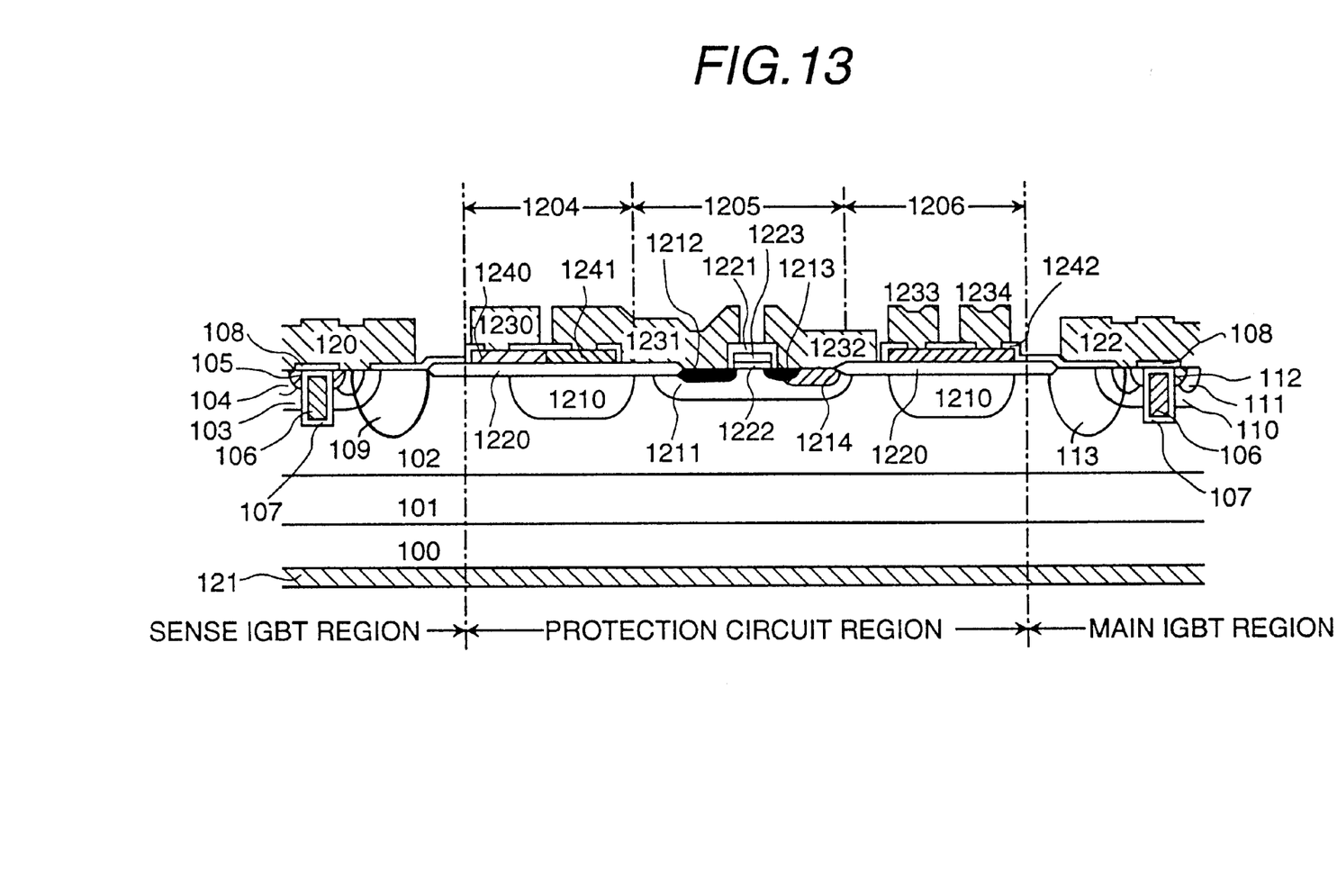
FIG. 13 is a vertical cross-sectional view of the structure of the semiconductor device shown in FIG. 12.
Figure 16:
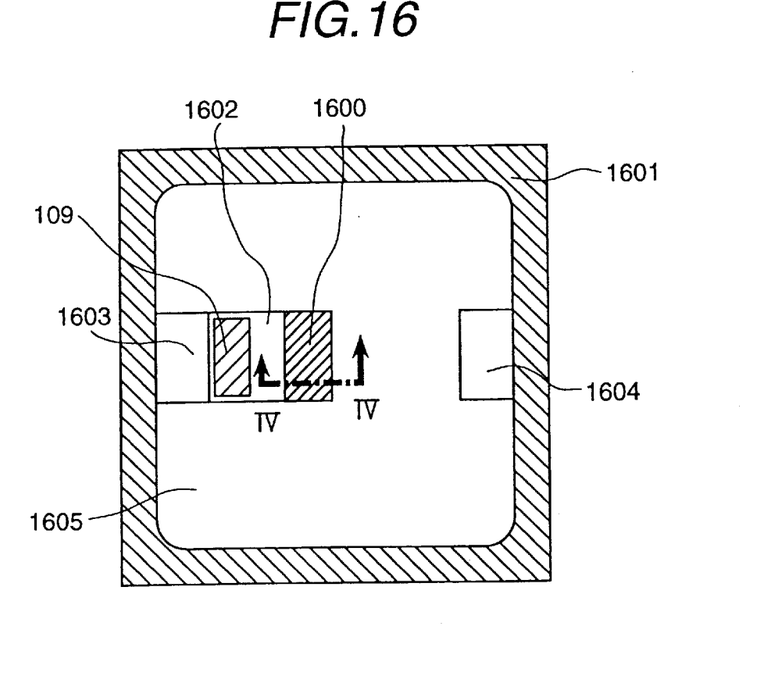
FIG. 16 is a plan view showing the structure of the semiconductor device according to the sixth embodiment shown in FIG. 12.

FIG. 12, FIG. 13 and FIG. 16 are a diagram of an equivalent circuit, a plan view and a vertical cross-sectional view of the structure, respectively, of a semiconductor device representing the sixth embodiment according to the present invention. FIG. 13 is a vertical cross-sectional view of the structure of the semiconductor device in which a cell shown by the equivalent circuit in FIG. 12 is formed in the same silicon substrate, and FIG. 16 shows a plan view of the structure. In FIG. 12, FIG. 13, and FIG. 16, the same numerals are used to denote the same elements as those shown in FIG. 1, FIG. 2, FIG. 5, FIG. 8, FIG. 10, FIG. 11 and FIG. 15.

Elements shown in FIG. 12, FIG. 13, and FIG. 16 which are different from the elements shown in FIG. 1, FIG. 2, FIG. 5, FIG. 8, FIG. 10, FIG. 11 and FIG. 16 are a protection circuit 1600 formed adjacent to the sense IGBT region 1602 and the main IGBT region 1605, the sense IGBT being formed adjacent to the protection circuit 1600 and neighboring the gate pad 1603 for leading out gate wires, a withstand voltage keeping region 1601, an emitter pad 1604 for leading out emitter wires, a collector electrode terminal 1200 serving as a main electrode, a gate electrode terminal 1201 for inputting a control signal to the IGBTs, an emitter electrode terminal 1202, a gate resister 1203 connected to the gates of the IGBTs, a diode 1204 having an anode 1230 connected to the gates of the IGBTs to prevent current from flowing into the IGBTs in reverse bias state of the gates, a MOSFET 1205, its gate being connected to the emitter of the sense IGBT, its drain 1212 being connected to a cathode 1241 of the diode 1204, and its source 1213 being connected to its emitter electrode terminal 1202, a sense resister 1206 inserted between the emitter and the emitter electrode terminal 1202 of the sense IGBT for detecting current, a breaker well layer 1210 formed in the drift layer 102 between a protection circuit region and the main IGBT region, as well as between the protection circuit region and the sense IGBT region, a MOSFET base layer 1211 formed in the drift layer 102 within the protection circuit region, a drain layer 1212, a source layer 1213 and a MOSFET contact layer 1214 which are formed in a MOSFET base layer 1211, an oxide film 1220 formed in a region other than the region in which the MOSFET 1205 is formed, an inter-layer insulation film 1221 for electrically separating the gate of the MOSFET 1205, a gate insulation film 1222, an anode electrode 1230 and a cathode electrode 1231 of the reverse gate bias prevention diode 1204 formed on an oxide film 1220, a MOSFET source electrode 1231 formed on and in contact with a source layer 1213 of the MISFET 1205, a polycrystal silicon film 1242, and electrodes 1233 and 1234 of the sense resistor 1206 formed an oxide film 1220, and finally, an anode layer 1240 and a cathode layer 1241 of the reverse gate bias prevention diode 1204 formed on the oxide film 1220. FIG. 13 is a vertical cross-sectional view at the position (IV—IV) shown in FIG. 16.

A feature of this embodiment is that an over-current protection circuit is formed in a semiconductor substrate together with a trench gate type IGBT including a current sensing cell. As mentioned above, since the change rate of current during the switching state is large in a trench gate type IGBT, a large current flows into the IGBT quickly in the case of a fault, such as a short circuit of a load, and the IGBT breaks down.

According to this embodiment, by forming the over-current protection circuit and the trench gate type IGBT in the same semiconductor substrate, in addition to maintaining the high performance of the IGBT, the rise time of the protection circuit can be largely improved. This protection circuit integrated IGBT can be realized by a simple circuit shown in FIG. 12, and if an over-current flows in the IGBT, the protection circuit rapidly operates and interrupts or restricts the over-current. If the protection circuit restricts the over-current, it is preferable when the circuit lowers the over-current to a level at which the IGBT works without breaking down during a period of several $\mu$s to tens $\mu$s, and further, the IGBT is turned off by a control means, such as a soft switching, which is executed by a control circuit provided outside.

Although an example in which a planar gate type MOSFET is applied to the protection circuit has been described with reference to FIG. 13, when taking the consistency in processing of a chip into consideration, it is desirable to adopt trench gates for the gate electrodes of the MOSFET.

Hitherto, examples wherein the present invention is applied to an IGBT in which each trench gate is formed in a stripe shape, what is called a stripe gate structure trench IGBT, have been explained. However, the application of the present invention is not restricted to a stripe gate structure trench IGBT, and even if the present invention is applied to gate structure trench IGBT of another shape, the above-mentioned effects of the present invention can be obtained. For example, by applying the structures devised in the present invention to an IGBT in which trench gate cells are arranged as a mesh pattern, what is called a mesh gate structure trench IGBT, similar effects can be obtained.

Figure 17:
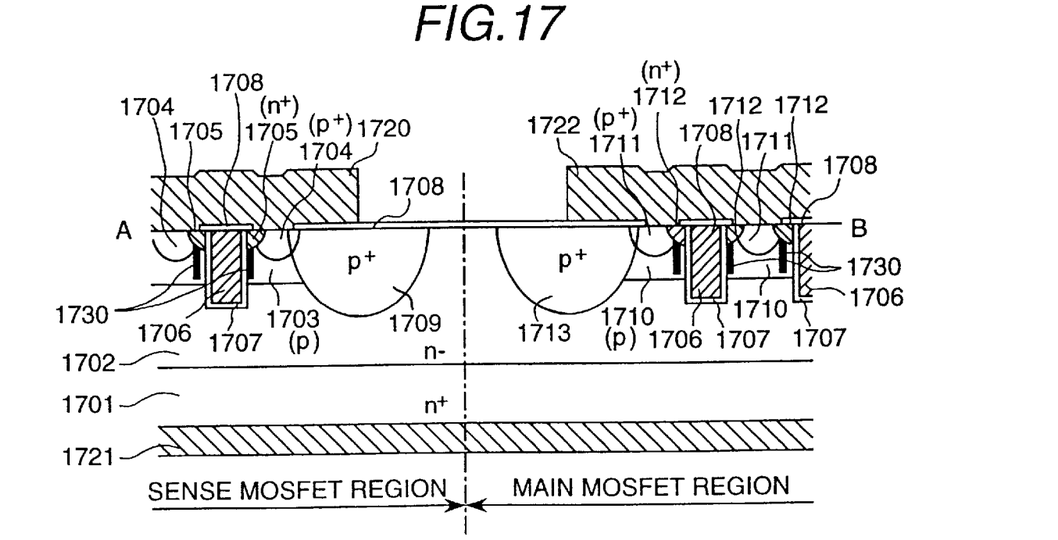
FIG. 17 is a vertical cross-sectional view showing an example of a system to which a semiconductor device according to the present invention is applied.

Further, although in the above-mentioned embodiments, the present invention is applied to an IGBT, the present invention can be applied to any type of semiconductor device having an insulation gate structure, and similar effects can be obtained. In FIG. 17, an embodiment in which the present invention is applied to a semiconductor device composed of MOSFETs is shown. The semiconductor device of this embodiment includes a drain layer 1701 adjacent to a drain electrode 1721, a drift layer 1702 adjacent to the drain layer 1701, which includes impurities of a lower concentration than that in the drain layer 1701, a sense base layer 1703 formed in the drift layer 1702 of a sense MOSFET region, a sense contact layer 1704 formed in the sense base layer 1703, sense emitter layers 1705 formed in the sense base layer 1703. trench gate electrodes 1706 formed so as to reach the drift layer 1702 in a silicon substrate, gate insulation films 1707 for electrically separating the gate electrodes 1706 from the silicon substrate, inter-layer insulation films 1708 for electrically insulating the sense and main emitter electrodes from the silicon substrates, a sense well layer 1709 formed adjacent to the side end part of the sense base layer 1709 of the sense MOSFET region, a main base layer 1710 formed in the drift layer 1702 of a main MOSFET region, a main contact layer 1711 formed in the main base layer 1710, main emitter layers 1712 formed in the main base layer 1710, a main well layer 1713 formed adjacent to the side end part of the main base layer 1710 of the main MOSFET region, a sense electrode 1720 formed in contact with the sense contact layer 1704 and the sense emitter layers 1705, a drain electrode 1721 formed on the whole face of the drain layer 1701, an emitter electrodes 1722 formed in contact with the main contact layer 1711 and the main emitter layers 1712, and channel forming regions 1730 formed along side walls of trench gates 1706 in the main base layer 1710 and the sense base layer 1703.

A MOSFET is a unipolar device in which a current flow is generated by electrons injected from a MOS gate, which is different from an IGBT. That is, in a MOSFET, the whole current flow is composed of electrons, and this situation is different from that in a IGBT. A purpose of the first embodiment is to suppress the interaction between a main IGBT and a sense IGBT, that is, mainly to suppress a leakage current composed of electrons flowing between the main IGBT and the sense IGBT. Therefore, the advantage of applying the present invention to a MOSFET becomes sometimes larger in comparison with the application of the invention to an IGBT.

In the following, a seventh embodiment will be explained.

Figure 14:
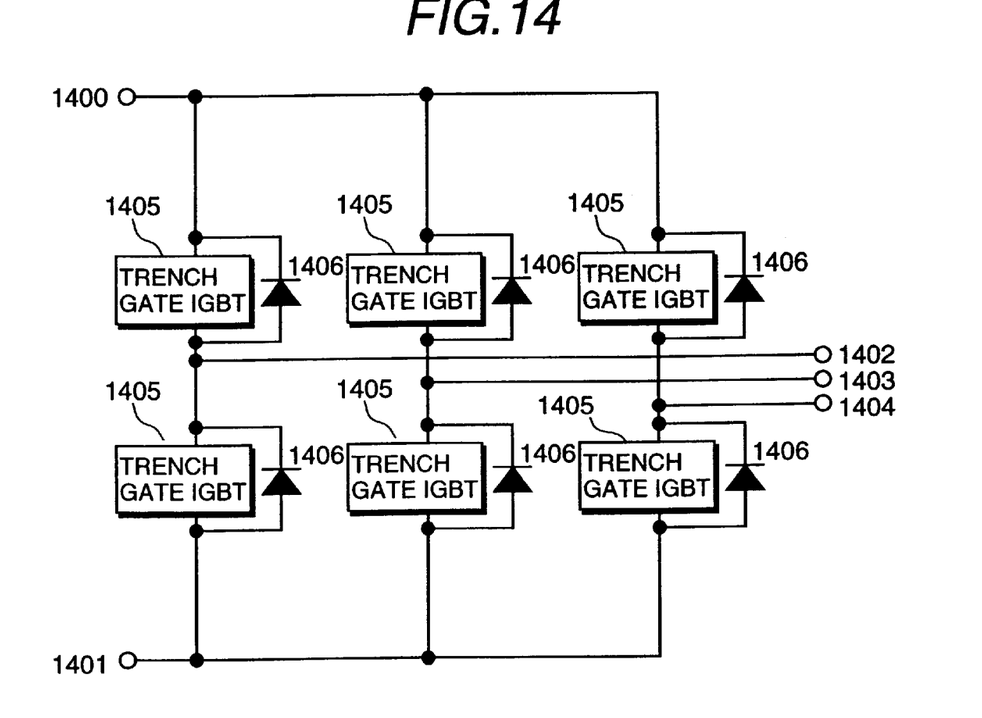
FIG. 14 is a block diagram showing an equivalent circuit of a semiconductor device representing a seventh embodiment according to the present invention.

FIG. 14 shows an equivalent circuit diagram of an inverter system representing the seventh embodiment according to the present invention.

As shown in FIG. 14, the system of this embodiment is composed of a pair of direct current input terminals 1400 and 1401, switching elements composed of a pair of trench gate type semiconductor switching devices, each of the switching devices possessing a current sensing function 1405, to which the present invention is applied, each pair of the semiconductor devices being serially connected between the pair of direct current input terminals 1400 and 1401, a set of alternating current output terminals 1402–1404, each output terminal being connected to a middle connection point of each pair of the two trench gate type semiconductor devices 1405, and feedback diodes 1406, each of the diodes 1406 being connected to each trench gate type semiconductor device in reverse parallel connection.

A feature of this embodiment is that trench gate type semiconductor switching devices with a current sensing function are applied to an inverter system. If an over-current flow is detected by one of the trench gate type semiconductor switching devices 1405, the trench gate type semiconductor switching device is turned off by a control unit not shown in the figure, and the inverter system is protected.

If the present invention is applied to an inverter system, since an IGBT includes a high-accuracy over-current sensing cell, the current flow in the system can be detected with a high-accuracy without providing a current probe for current detection, which can reduce the production cost of the inverter system.

Since it is not restricted to the application to an inverter system, the present invention can be naturally applied to a current or voltage conversion circuit having a similar composition to an inverter system, such as a power converter system, a chopper system, and so forth, which also attain the above-mentioned advantages.

Figure 6:
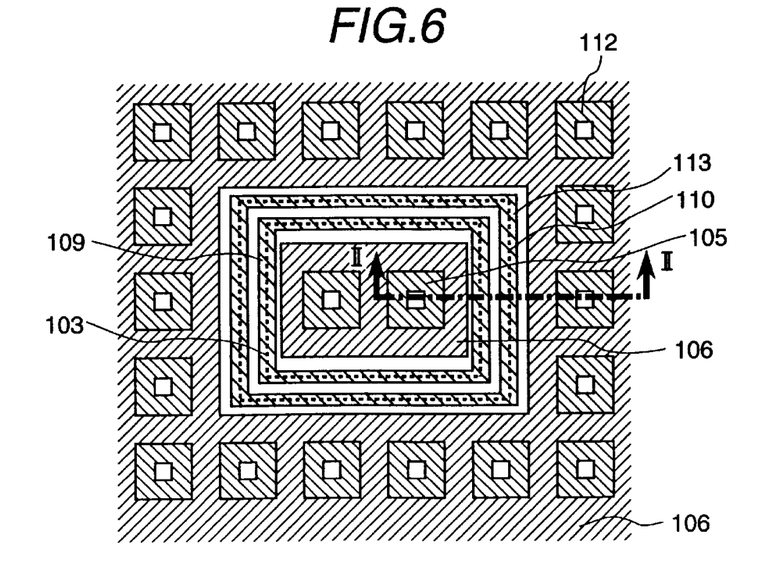
FIG. 6 is a plan view showing the structure of a semiconductor device having a mesh cell structure, according to the present invention.
Figure 7:
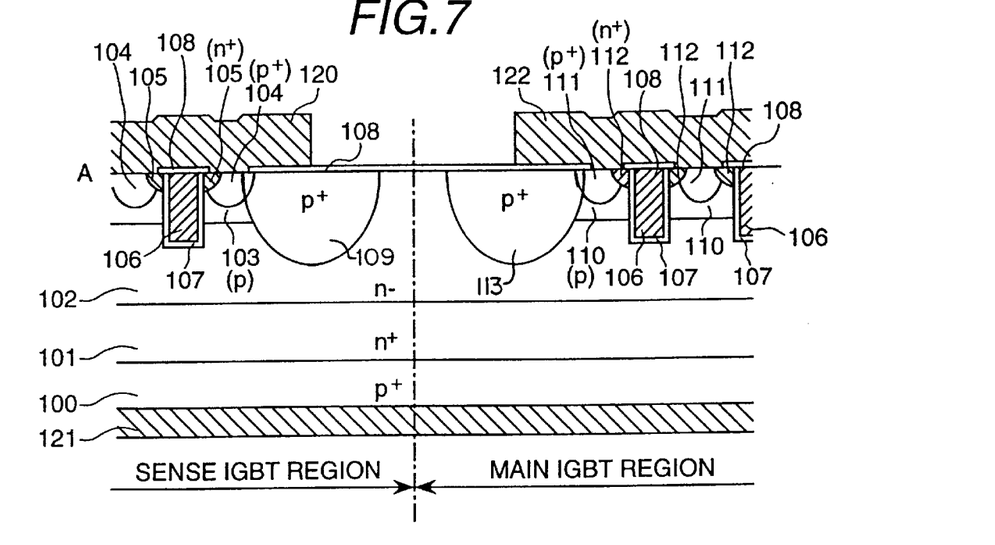
FIG. 7 is a vertical cross-sectional view of the structure of the semiconductor device shown in FIG. 6.

FIG. 6 and FIG. 7 are a plan view and a vertical cross-sectional view showing the structure of a semiconductor device, respectively, in which mesh cell structure trench gate type IGBTs are used, and the present invention is applied to these IGBTs. FIG. 7 shows a vertical cross-sectional view at the position (II—II) shown in FIG. 6. In FIG. 7, the same numerals are used to denote the same components as those shown in FIG. 1. As shown in FIG. 6, by arranging the mesh of the main IGBT cells and that of the sense IGBT cells in the same direction, the accurate current balance effect mentioned in connection with the above embodiments can be also obtained.

Furthermore, the application of the present invention is not restricted to an IGBT, since the invention can be applied to other types of device including trench gates, such as a trench gate type MOSFET, etc., which can also bring a similar effect.

In accordance with the present invention, high accuracy current sensing becomes possible since the difference between the performance of the main IGBT and that of the sense IGBT can be removed by forming the orientation of the crystal face at the side walls of the trenches in a sense IGBT so that it is equal or equivalent to the orientation of the crystal face at the side walls of the trenches in a sense IGBT. Further, since the interaction between the main IGBT and the sense IGBT also can be suppressed, high accuracy current sensing can be realized.

What is claimed is:

1. A semiconductor device, comprising: a main cell which has trench gates for the flow of a main current, and a current sensing cell which has trench gates for the flow of a current to detect said main current, said main cell and said current sensing cell being formed at the same semiconductor substrate, wherein the orientation of the crystal face at the side walls of the trenches composing channels of said trench gates in said main cell is the same or almost the same as that at the side walls of the trenches composing channels of said trench gates in said current sensing cell, wherein said trench gates in said main cell and said trench gates in said current sensing cell reach a drift layer in said semiconductor substrate, and wherein each trench gate in said main cell and each trench gate in said current sensing cell have end portions, respectively with respect to a plan view of the device, and are separated from each other.

2. A semiconductor device according to claim 1, wherein a well layer deeper than each trench gate is formed between said trench gates in said main cell and said trench gates in said current sensing cell, and wherein each of the side end parts of said main cell and said current sensing cell is surrounded by said well layer of which the depth is deeper than the depth of said trench gates.

3. A semiconductor device according to claim 1, further including a current sensing pad electrically connected to an emitter electrode of said current sensing cell, and a pad well layer formed in a semiconductor substrate, which is electrically connected to said emitter electrode of said current sensing cell, wherein said current sensing pad is formed on said pad well layer, and wherein said pad well layer is formed in a region other than the region in which said trench gates are formed.

4. A semiconductor device according to claim 1 wherein a dummy cell which does not operate as an element is arranged adjacently to said current sensing cell.

5. A semiconductor device, comprising: a main cell which has trench gates for the flow of a main current, and a current sensing cell which has trench gates for the flow of a current to detect said main current, said main cell and said current sensing cell being formed at the same semiconductor substrate, wherein the orientation of the crystal fact at the side wall of the trenches composing channels of said trench gates in said main cell is the same or almost the same as that at the side walls of the trenches composing channels of said trench gates in said current sensing cell, and wherein a separation trench gate having a width which is wider than the width of said trench gates in said main cell and said current sensing cell is arranged between said main cell and said current sensing cell.

6. A semiconductor device according to claim 5, wherein said separation trench gate is electrically separated from said main cell and said current sensing cell.

7. A power conversion device for providing an AC output, including a pair of direct current (DC) terminals, a set of alternating current (AC) terminals of which the number is the same as that of the number of phases in the AC output, a plurality of inverter units each of which is composed of two circuits serially connected between said pair of DC terminals, each circuit consisting of a switching element and a feedback diode connected in reverse parallel connection to said switching element, a middle connection point of the two points of each inverter unit being connected to a respective one of said AC terminals, the number of said inverter units being the same as the number of said phases of the AC output at said set of AC terminals, wherein said switching elements comprise semiconductor devices according to claim 1.

* * * * *